(12) United States Patent
Yoshikawa

(10) Patent No.: US 11,664,190 B2
(45) Date of Patent: May 30, 2023

(54) ELECTRON BEAM DEVICE AND IMAGE ACQUISITION METHOD

(71) Applicant: KIOXIA CORPORATION, Tokyo (JP)

(72) Inventor: Ryoji Yoshikawa, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 6 days.

(21) Appl. No.: 17/410,788

(22) Filed: Aug. 24, 2021

(65) Prior Publication Data

US 2022/0084782 A1 Mar. 17, 2022

(30) Foreign Application Priority Data

Sep. 11, 2020 (JP) .............................. JP2020-152972

(51) Int. Cl.
*H01J 37/28* (2006.01)
*H01J 37/20* (2006.01)
*H01J 37/22* (2006.01)
*H01J 37/073* (2006.01)
*H01J 37/153* (2006.01)

(52) U.S. Cl.
CPC ............ *H01J 37/28* (2013.01); *H01J 37/073* (2013.01); *H01J 37/153* (2013.01); *H01J 37/20* (2013.01); *H01J 37/222* (2013.01)

(58) Field of Classification Search
CPC .. H01J 37/00; H01J 37/02; H01J 37/26; H01J 37/28; H01J 37/073; H01J 37/153; H01J 37/20; H01J 37/222; H01J 37/026; H01J 2237/024; H01J 2237/2814; H01J 2237/2817; G03F 7/0002; G03F 1/78; G03F 1/86

USPC ........................................ 250/306, 307, 311
See application file for complete search history.

(56) References Cited

U.S. PATENT DOCUMENTS

| | | | |
|---|---|---|---|
| 6,936,981 B2 | 8/2005 | Gesley | |
| 9,922,796 B1 | 3/2018 | Frosien et al. | |
| 2009/0090863 A1* | 4/2009 | Watanabe | G01N 23/2251 250/307 |
| 2010/0181480 A1 | 7/2010 | Shimakura et al. | |
| 2011/0278453 A1 | 11/2011 | Oosaki et al. | |
| 2016/0013010 A1* | 1/2016 | Kanno | H01J 37/21 250/440.11 |

(Continued)

FOREIGN PATENT DOCUMENTS

| | | |
|---|---|---|
| JP | 2010033724 A | 2/2010 |
| JP | 2020085838 A | 6/2020 |

(Continued)

*Primary Examiner* — Jason L Mccormack
(74) *Attorney, Agent, or Firm* — Kim & Stewart LLP

(57) ABSTRACT

According to one embodiment, an electron beam device includes a support which supports the sample and an electrode disposed below the sample on the support The electrode is for applying a voltage to the sample and includes a plurality of columnar electrodes that can be independently controlled to apply different voltages to portions of the sample. A controller for generating correction data for correcting the distribution of an electric field generated across the area of the sample. The correction data is generated based on structure information indicating a structure of the sample. The controller controls the plurality of columnar electrodes to apply local voltages set based on the correction data.

20 Claims, 6 Drawing Sheets

(56) References Cited

U.S. PATENT DOCUMENTS

2018/0358199 A1    12/2018    Kumamoto et al.
2020/0035450 A1*   1/2020     Mizutani ................. H01J 37/28
2021/0296081 A1    9/2021     Imai et al.

FOREIGN PATENT DOCUMENTS

TW        201833967 A     9/2018
WO        2019224896 A1   11/2019

* cited by examiner

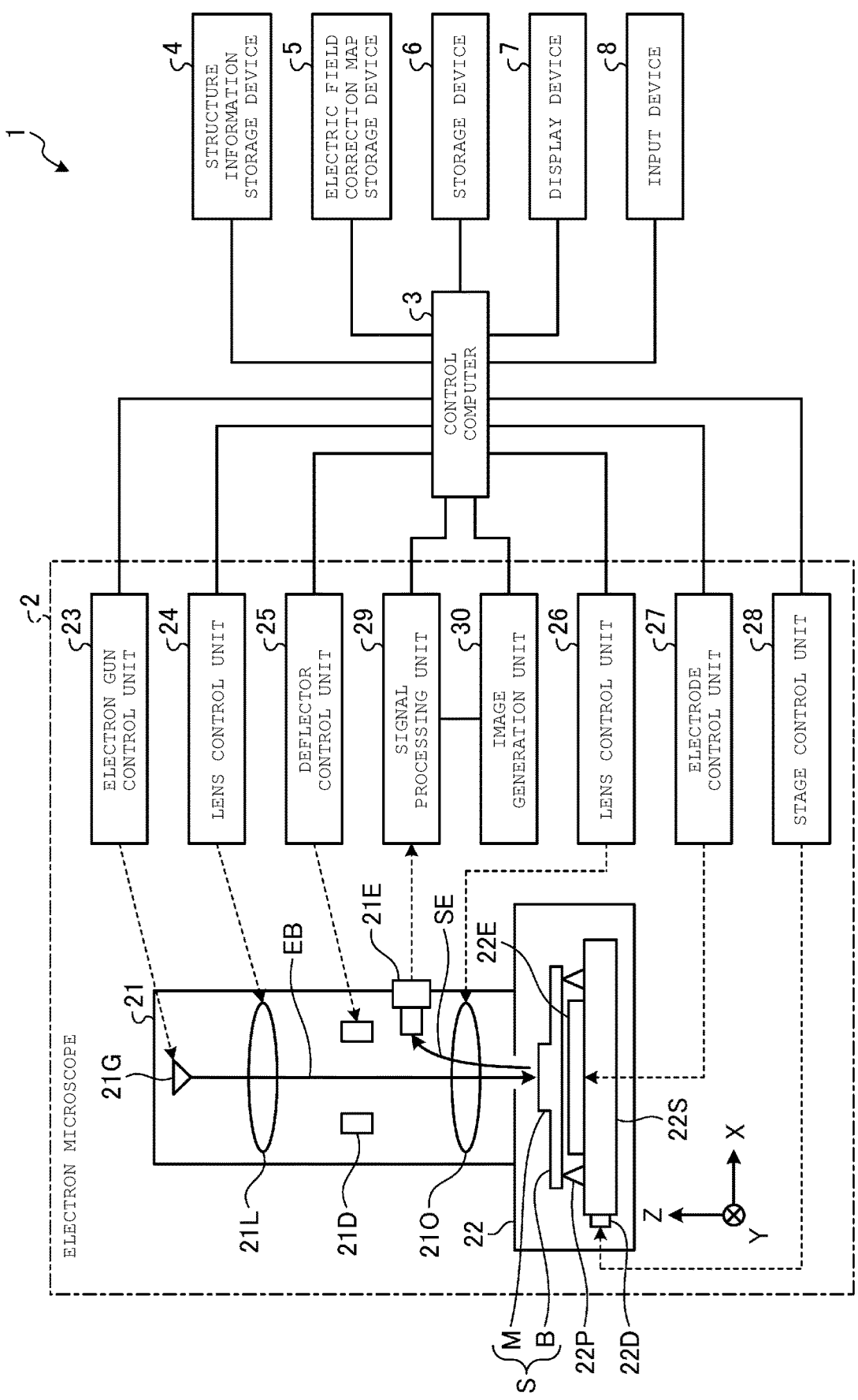

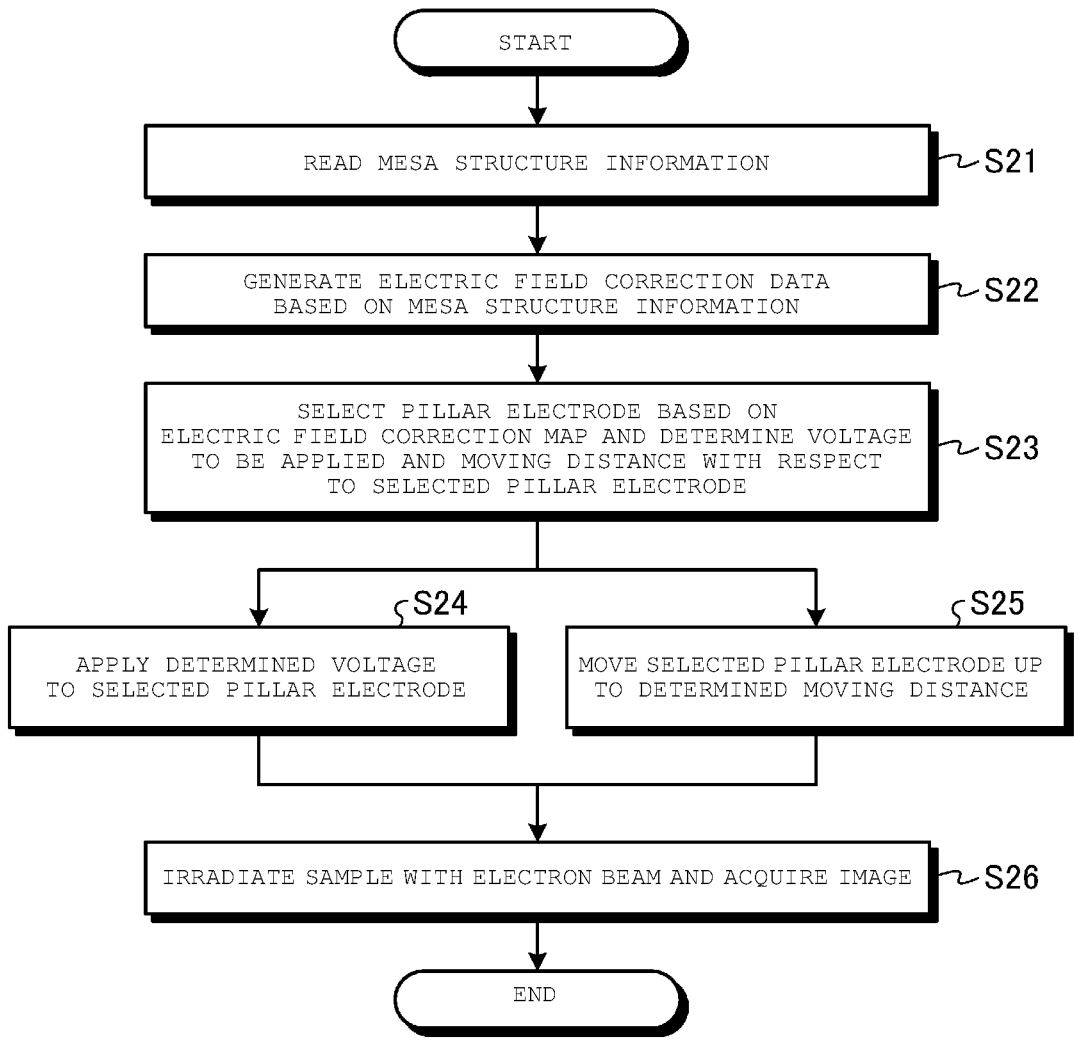

ELECTRON BEAM DEVICE AND IMAGE ACQUISITION METHOD

CROSS-REFERENCE TO RELATED APPLICATION

This application is based upon and claims the benefit of priority from Japanese Patent Application No. 2020-152972, filed Sep. 11, 2020, the entire contents of which are incorporated herein by reference.

FIELD

Embodiments described herein relate generally to an electron beam device and an image acquisition method.

BACKGROUND

The imprint lithography process is known as a semiconductor manufacturing process. In the imprint lithography process, a resist film is patterned into an etching mask by pressing a template against the resist film. The resist film is formed on the layer to be subsequently etched. The template used for the imprint lithography has a pattern that is the same size as the pattern being formed for the semiconductor device. With the miniaturization of semiconductor devices, the template pattern also has to be correspondingly miniaturized. To use a template for manufacturing a semiconductor device, it is generally first required to inspect and measure the pattern that has been formed on the template, but the miniaturization of the pattern on the template makes inspection and measurement more difficult.

BRIEF DESCRIPTION OF THE DRAWINGS

FIG. 1 is a block diagram illustrating a schematic configuration of an electron beam device according to an embodiment.

FIG. 6 is a flowchart of an image acquisition method that can be carried out by using an electron beam device according to the modification example.

DETAILED DESCRIPTION

Figure 2A:
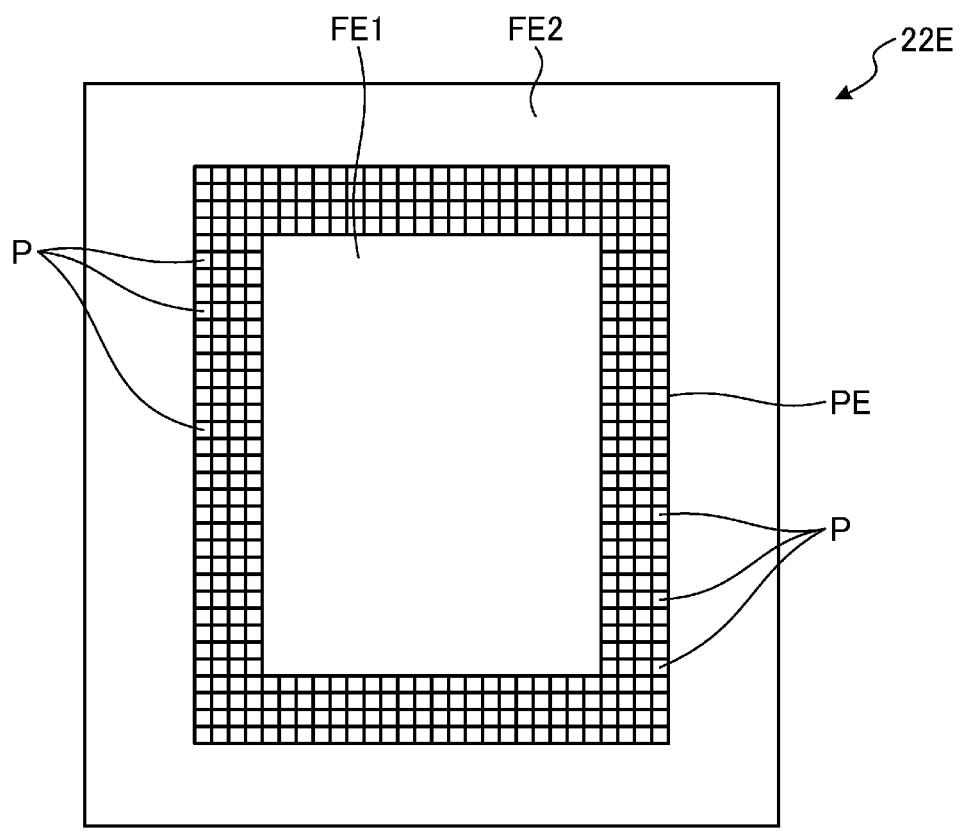
FIG. 2A is a top view schematically illustrating a retarding electrode.

At least one example embodiment provides an electron beam device and an image acquisition method capable of improving the accuracy of inspection and measurement of fine patterns.

In general, according to one embodiment, an electron beam device for acquiring an image of a sample is provided. The electron beam device includes a support on which a sample can be supported and an electrode for applying voltages to the sample being supported by the support. The electrode is between the sample and the support when the sample is supported on the support. The electrode has a plurality of columnar electrodes which can each be independently controlled to apply a different voltage. A controller is configured to generate correction data for adjusting the distribution of an electric field generated in the sample when a voltage is applied to the sample via the electrode. The correction data is based on structure information indicating a structure of the sample. The controller controls the plurality of columnar electrodes to apply local voltages set based on the correction data.

Hereinafter, certain non-limiting embodiments of the present disclosure will be described with reference to the accompanying drawings. In the attached drawings, the same or corresponding members or components are designated by the same or corresponding reference numerals, and duplicate description is omitted. Furthermore, the drawings are not intended to illustrate relative dimensional ratios between members or components, or between the thicknesses of various layers, and thus, a specific thickness and a dimension should be determined by those skilled in the art in the light of the following non-limiting embodiments.

FIG. 1 is an example of a block diagram illustrating a schematic configuration of an electron beam device according to an embodiment. As illustrated in FIG. 1, an electron beam device 1 includes an electron microscope 2, a control computer 3, a structure information storage device 4, and an electric field correction map storage device 5.

The electron microscope 2 may be a scanning electron microscope (SEM). As illustrated in the drawing, the electron microscope 2 includes a lens barrel 21, a sample chamber 22, an electron gun control unit 23, a lens control unit 24, a deflector control unit 25, a lens control unit 26, an electrode control unit 27, a stage control unit 28, a signal processing unit 29, and an image generation unit 30.

The lens barrel 21 is provided with an electron gun 21G, a condenser lens 21L, a deflector 21D, an objective lens 21O, and a detector 21E.

The sample chamber 22 is provided with a stage 22S that can move at least in the XYZ directions, a support pin 22P that is disposed on the stage 22S and supports a sample S to be inspected and measured, a retarding electrode 22E disposed on the stage 22S with a gap, and a drive mechanism 22D for driving movement of the stage 22S.

A sample S can be placed in the sample chamber 22 to be supported by the support pin 22P. The sample S is, for example, a template used for imprint lithography. The template, as illustrated in FIG. 1, has a mesa portion M that will be brought into contact with the resist film when the template is pressed on the resist film, and a base portion B at the periphery thereof. The mesa portion M protrudes from the base portion B, and thus, a step of, for example, approximately 10 to 40 microns (μm) is in the Z direction between the mesa portion M and the base portion B.

The control computer 3 is connected to the electron gun control unit 23, the lens control units 24 and 26, the deflector control unit 25, the electrode control unit 27, the stage control unit 28, the signal processing unit 29, and the image generation unit 30 of the electron microscope 2. The structure information storage device 4 and the electric field correction map storage device 5 are also connected to the control computer 3.

A storage device 6, a display device 7, and an input device 8 may be connected to the control computer 3. The storage device 6 may be implemented as a hard disk drive (HDD), a semiconductor memory, or the like. The storage device 6 receives, from the control computer 3, and stores an electron beam condition, the type of the inspection measurement target pattern, the coordinate position of the inspection and measurement region, various threshold values for inspection and measurement, or the like, which are input from the input device 8. The storage device 6 can also receive (via the control computer 3) and store the image signal generated by the image generation unit 30 of the electron microscope 2.

The display device 7 may be, for example, a liquid crystal display or an organic EL display, and can display a surface image of the sample S based on an image signal from the control computer 3. The input device 8 may be, for example, a keyboard or a computer mouse, or the like and may also include an interface apparatus for connecting the control computer 3 to the Internet or a local area network. Information such as electron beam conditions, beam settings, imaging parameters, the type of the inspection measurement target pattern, the coordinate position of the inspection and measurement region, various threshold values for inspection and measurement, or the like can be input to the control computer 3 through the input device 8.

The control computer 3 may be implemented as a general-purpose computer including a CPU, a ROM, a RAM or the like. In some examples, the control computer 3 may be implemented by hardware such as an integrated circuit (ASIC) for a specific application, a programmable gate array (PGA), and/or a field programmable gate array (FPGA). In the present example, the control computer 3 comprehensively controls the electron beam device 1 based on a control program and various data. Specifically, the control computer 3 generates various control signals based on a control program and various data, and transmits the generated control signal to the electron gun control unit 23, the lens control units 24 and 26, the deflector control unit 25, the electrode control unit 27, the stage control unit 28, the signal processing unit 29, the image generation unit 30, or the like of the electron microscope 2. The program and various data can be downloaded by wired connection or wirelessly from a non-transitory computer-readable storage media such as a hard disk drive (HDD), a semiconductor memory, or a server. The control computer 3 may also be referred to as a controller or the like.

The electron gun control unit 23 is connected to the electron gun 21G in the lens barrel 21. The electron gun control unit 23 controls the electron gun 21G based on the control signal from the control computer 3. Specifically, the electron gun control unit 23 can cause the electron gun 21G to emit an electron beam EB (primary electron beam) for a predetermined period of time or adjust the intensity of the electron beam EB.

The lens control unit 24 is connected to the condenser lens 21L. The lens control unit 24 controls the condenser lens 21L based on the control signal from the control computer 3. For example, the lens control unit 24 can focus the electron beam EB emitted from the electron gun 21G using the condenser lens 21L.

The deflector control unit 25 is connected to the deflector 21D. The deflector control unit 25 controls the deflector 21D based on the control signal from the control computer 3. The deflector control unit 25 causes the deflector 21D to generate a deflection electric field or a deflection magnetic field to deflect the electron beam EB in the X and Y directions. Accordingly, the electron beam EB can scan the surface of the sample S.

The lens control unit 26 is connected to the objective lens 21O. The lens control unit 26 controls the objective lens 21O based on the control signal from the control computer 3. Specifically, the focal position of the electron beam EB can be adjusted, and the electron beam EB focused on the surface of the sample S.

The electrode control unit 27 is connected to the retarding electrode 22E. The electrode control unit 27 controls the retarding electrode 22E based on the instruction signal of the control computer 3. A so-called retarding voltage is applied to the retarding electrode 22E. The retarding voltage is a voltage applied to the stage 22S in order to decelerate the electrons incident on the sample S. When the electrons are decelerated in this manner, the charge on the surface of the sample S can be reduced and the image provided by the electron microscope 2 can be sharpened. The structure of the retarding electrode 22E and the control of the retarding electrode 22E by the electrode control unit 27 will be described further below.

The stage control unit 28 is connected to the drive mechanism 22D of the stage 21S. The stage control unit 28 moves the stage 21S in the X direction and the Y direction based on the control signal from the control computer 3.

The signal processing unit 29 is connected to the detector 21E and receives an output signal from the detector 21E. When the sample S is irradiated with the electron beam EB, secondary electrons SE are emitted from the surface of the sample S. When a secondary electron SE is incident on the detector 21E, the detector 21E generates a pixel signal in accordance with the number and position of incident secondary electrons SE. This pixel signal is received by the signal processing unit 29 as an output signal. The signal processing unit 29 performs signal processing such as noise reduction processing and amplification on the received signal, performs analog-to-digital (AD) conversion on the processed signal, and transmits the digital signal to the control computer 3. The signal processing unit 29 can also control the detector 21E based on the control signal from the control computer 3. Specifically, ON/OFF and sensitivity of the detector 21E can be controlled by the signal processing unit 29 based on the control signal from the control computer 3.

The image generation unit 30 is connected to the signal processing unit 29 and receives a digital signal from the signal processing unit 29. The image generation unit 30 performs predetermined image processing on the received digital signal to generate an image signal. The image signal is transmitted to the display device 7 through the control computer 3, and the secondary electron image of the surface of the sample S is displayed on the display device 7. The image signal may be transmitted to the storage device 6 through the control computer 3 and stored there.

The structure information storage device 4 may be implemented as a hard disk drive (HDD), a semiconductor memory, or the like. The structure information storage device 4 receives and stores the structure information of the sample S as input from the input device 8 through the control computer 3. The structure information may be, for example, the mesa structure information of a template that is the sample S. The mesa structure information includes information about the planar shape and the height of the mesa portion M. The mesa structure information may include, for example, the grid coordinates regarding divisions of the surface of the template (the surface of the side pressed against the resist film) for the sample S to be inspected and measured, and the known or expected feature heights within the grid divisions associated with the various grid coordinates. The mesa structure information may include a coordinate position on the surface of the template associated with a surface height at the coordinate position.

The mesa structure information may be provided as, or generated from, CAD (computer-aided design) data used when designing the mesa structure of the template, or may be measurement data from the sample S. Furthermore, it may include the design data for the device pattern (s) to be formed by using the template. In this case, the design data may include data related to the shape of the outer circumference (for example, the kerf region) of the chip. When the design data including such data is input from the input device 8, it may be displayed on the display device 7, and based on the display, it can be processed into mesa structure information. The mesa structure information may be input from the input device 8 and stored in the structure information storage device 4.

The electric field correction map storage device 5 stores an electric field correction map calculated by the control computer 3 based on the mesa structure information.

Figure 2B:
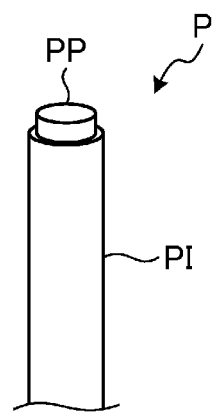
FIG. 2B is a partial perspective view schematically illustrating an upper end portion of a pillar electrode of a retarding electrode.

Next, the retarding electrode 22E will be described with reference to FIGS. 2A and 2B. FIG. 2A is a top view schematically illustrating the retarding electrode 22E, and FIG. 2B is a partial perspective view schematically illustrating a pillar electrode P in the retarding electrode 22E.

As illustrated in FIG. 2A, in the present embodiment, the retarding electrode 22E has a flat plate electrode region FE1, a pillar electrode region PE, and a flat plate electrode region FE2. Specifically, the flat plate electrode region FE1 has a rectangular shape in plan view, and the pillar electrode region PE surrounds the flat plate electrode region FE1. Further, the flat plate electrode region FE2 surrounds the pillar electrode region PE. The flat plate electrode regions FE1 and FE2 are formed of, for example, a metal such as copper and have a flat upper surface. The flat plate electrode regions FE1 and FE2 are electrically connected to the electrode control unit 27, and a voltage is applied by the electrode control unit 27. The same voltage may be applied to the flat plate electrode regions FE1 and FE2, or different voltages may be applied under the control of the electrode control unit 27.

The pillar electrode region PE has dimensions comparable to the dimensions of the sample S (specifically, the template) to be inspected and measured. Specifically, the pillar electrode region PE has an outer circumference larger than the outer circumference of the mesa portion M of the template and a smaller inner circumference, to correspond to the range in which the edge of the mesa portion M of the template will be positioned. The outer surface of the mesa portion M is not always flat, and may have a portion protruding outward or a portion recessed inward. In this case, it is preferable that even the protruding portion and the recessed portion still be within the range covered the pillar electrode region PE.

The pillar electrode region PE has a plurality of pillar electrodes P therein. FIG. 2B is a partial perspective view schematically illustrating an upper end portion (end portion facing the sample S) of a pillar electrode P. As illustrated in FIG. 2B, the pillar electrode P has a cylindrical body PP and an insulating film PI covering the outer peripheral surface of the cylindrical body PP. The cylindrical body PP may be formed of a metal such as copper. A lead wire (wiring lead) is connected to the cylindrical body PP at the lower end thereof, and the pillar electrode P and the electrode control unit 27 are electrically connected by this wire. Accordingly, a voltage can be individually applied to each pillar electrode P from the electrode control unit 27. The insulating film PI prevents an electrical short circuit between two adjacent pillar electrodes P. The insulating film PI may be formed of, for example, a resin material. In the illustrated example, a portion of the upper end side of the outer peripheral surface of the cylindrical body PP is exposed, but the insulating film PI can cover the entire outer peripheral surface of the cylindrical body PP.

The diameter of the pillar electrode P is preferably less than 1 mm, for example. As the pillar electrode P, a copper pillar electrode of the typed used in a flip chip bonding method (which is one of the methods commonly used for electrically connecting a semiconductor chip and a package terminal when the semiconductor chip is housed in the package) may be used. The diameter of the pillar electrode P can be 50 μm or less and the height can be 100 μm or more. In general, the smaller the diameter of the pillar electrode P, the finer the electric field correction that becomes possible.

The retarding electrode 22E is disposed on the stage 22S in FIG. 1 as an apparently discrete component. In some examples, the retarding electrode 22E may be integrated with the stage 22S. However, since the dimensions (particularly, the size and shape of the pillar electrode region PE) of the retarding electrode 22E may need to be changed according to the shape of the samples S, it is preferable to form the retarding electrode 22E be separable from the stage 22S so that it can be easily switched to another size and/or replaced.

Figure 3:
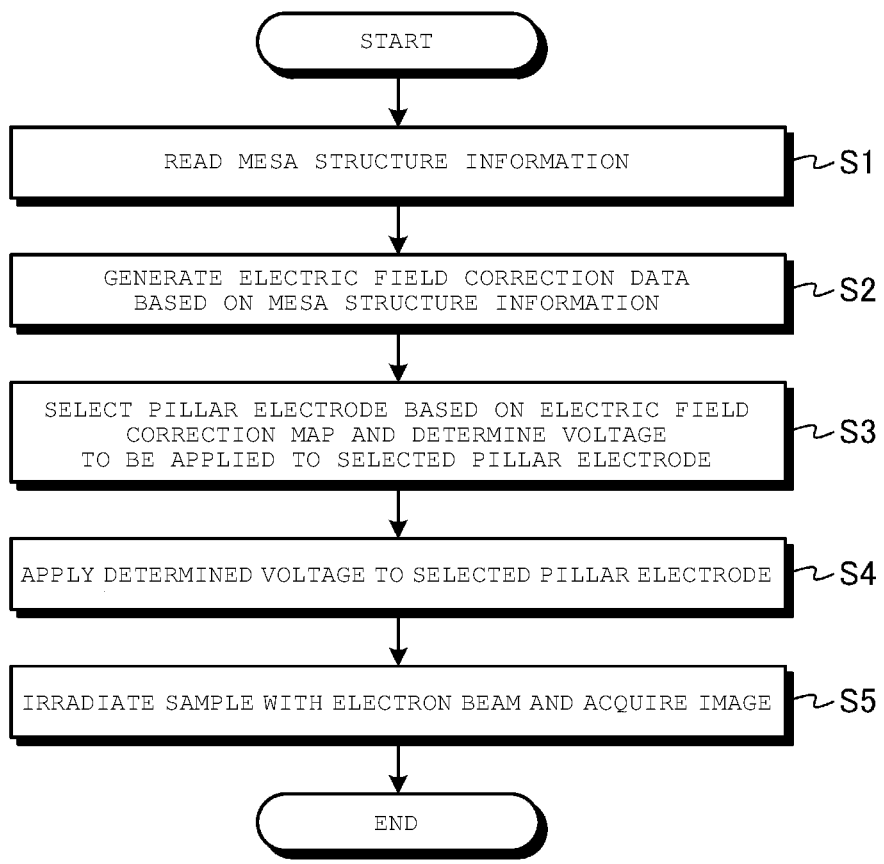
FIG. 3 is a flowchart of an image acquisition method according to an embodiment.

Next, an image acquisition method according to the embodiment will be described. This image acquisition method can be carried out using the electron beam device 1 described above. FIG. 3 is a flowchart of the image acquisition method. It is assumed that the sample S (template) to be the target of this method has been placed on the stage 22S in the electron beam device 1, and that the initial preparation of the electron microscope 2 is completed.

First, in a step S1, the template mesa structure information stored in the structure information storage device 4 is read into the control computer 3. As described above, the mesa structure information includes information on the planar shape and the height of the mesa portion.

Next, in a step S2, electric field correction data is generated using the read mesa structure information. An example of generating electric field correction data will be described.

Figure 4B:
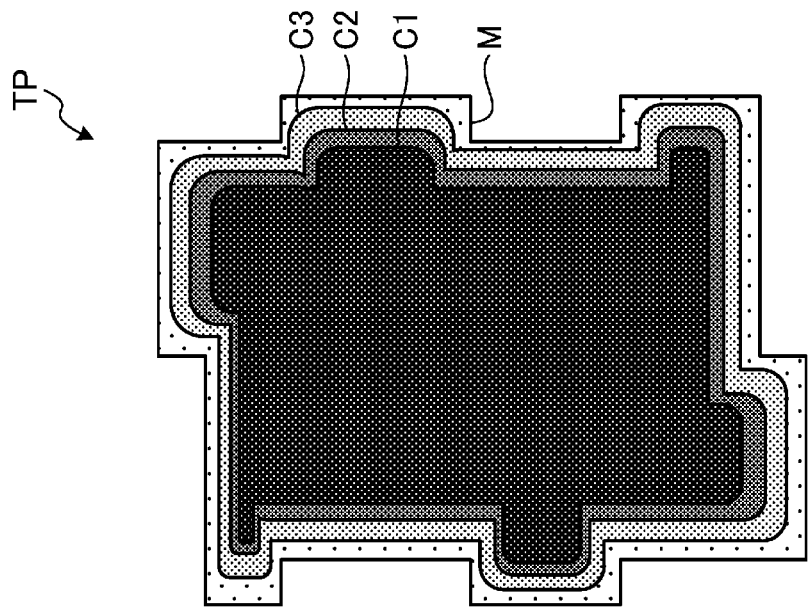
FIG. 4B is a diagram illustrating an electric field correction map calculated using mesa structure information.
Figure 4A:
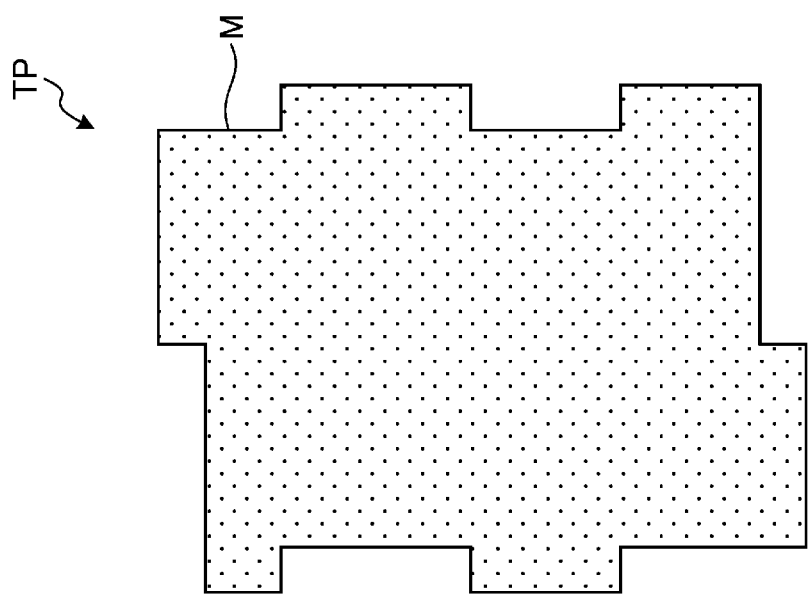
FIG. 4A is a schematic diagram illustrating the structure of a template created based on mesa structure information.

FIG. 4A is a schematic diagram illustrating the structure of the template TP (being used as the sample S) as defined by the mesa structure information, and FIG. 4B is a diagram illustrating the electric field correction data calculated using this mesa structure information. The calculated electric field correction data is presented as an electric field correction map. In FIG. 4A, the base portion B (see FIG. 1) is not specifically illustrated. Furthermore, although not limited to this, the height difference between the mesa portion M and the base portion B is 30 μm according to the mesa structure information in this example. The template TP is formed of, for example, a dielectric material such as quartz glass.

When such a template TP is placed on a metal flat plate so that its back surface is in contact with the flat plate, and a voltage can applied to the flat plate, the surface of the template TP is induced with charges that have a polarity opposite to the applied voltage. At this time, the induced charge tends to concentrate at the edge (or rim, corner) of the mesa portion M. This is because the electric charge is hard to be repelled at the edge, and because even if it is repelled, it cannot be further moved away from the edge, or the like. That is, when there is a step or the like due to the mesa portion M as in the template TP, the distribution of the induced charge may have variations across the mesa portion M. When such variations occur, a blanket, uniform retarding voltage would not be sufficient in view of the uneven distribution of charges across the mesa portion M to provide uniform deceleration of the electrons incident on the template TP.

The electric field correction map illustrated in FIG. 4B is created to correct or compensate for such a charge distribution. That is, the expected charge distribution is estimated by, for example, obtaining the position and the height of the edge of the mesa portion M based on the mesa structure information, and the distribution of the applied voltage that enables uniformization of the charge distribution based on the estimation result can be obtained.

In FIG. 4B, the distribution of the retarding voltage to be applied is represented by a series of contour lines C1, C2, C3. The illustrated example shows that the applied voltage should be reduced from the region inside the contour line C1, to the region between the contour lines C1 and C2, and then to region between the contour lines C2 and C3. That is, the edge of the mesa portion M of the template TP (sample S) can be considered to be positioned in the region between the contour lines C2 and C3, and by lowering the retarding voltage applied to this region as compared with other regions, the charge induced in the vicinity of the edge of the mesa portion M can be reduced, and thus the charge distribution on the surface of the template TP can be made uniform (or more uniform).

The electric field correction map can be created by, for example, a three-dimensional finite element method. A finite element method (FEM) is one of the numerical methods for solving the differential equation under a boundary condition, and since the structure is represented as a set of small polygons called elements, the structure of complex shapes can be also applicable, and a solution can be obtained numerically under a boundary condition given a differential equation. In some examples, the electric field correction map may be obtained by a dedicated electric field simulator or the like.

Returning to FIG. 3 again, in a step S3, the control computer 3 selects the pillar electrode(s) P of the retarding electrode 22E based on the electric field correction map, and obtains the voltage to be applied to each selected pillar electrode P. The control computer 3 transmits a control signal including the selected pillar electrode P coordinate (or other identifying information), and the voltage to be applied thereto, to the electrode control unit 27. The control signal may include, for example, a reference retarding voltage applied to the flat plate electrode regions FE1 and FE2 and the unselected pillar electrode (s) P, and the difference between a voltage to be applied to a selected pillar electrode P and the reference retarding voltage.

Next, in a step S4, the electrode control unit 27 applies a retarding voltage to the retarding electrode 22E. At this time, a predetermined voltage determined for the pillar electrode P is applied to the selected pillar electrode(s) P in the pillar electrode region PE. Accordingly, a different voltage is locally applied to the template TP. Accordingly, for example, the concentration of electric charges at the edge of the mesa portion M can be mitigated, and a uniform electric field can be generated on the surface of the template TP.

Next, in a step S5, the electron gun control unit 23 causes the electron gun 21G to emit the electron beam EB based on the control signal from the control computer 3. Furthermore, the deflector control unit 25 causes the scanning of the electron beam EB across the template TP, and an image (SEM image) due to the secondary electrons emitted from the surface of the template TP is acquired through the detector 21E. Accordingly, the series of processes associated with FIG. 3 is completed.

As described above, according to the electron beam device and the image acquisition method according to the embodiment, since a pillar electrode of the retarding electrode can be selected according to the electric field correction map generated based on the mesa structure information, and a predetermined voltage is applied to the selected pillar electrode, it is possible to make the electric field distribution on the template surface (sample S) more uniform. Accordingly, since the electron beam can be more uniformly incident on the template surface, it is possible to acquire an image that more accurately reflects the shape of the template surface.

An image acquisition method has been described with reference to FIG. 3. The series of processes illustrated in FIG. 3 can be carried out as one portion of a more complex measurement and inspection method. For example, when measuring the dimension of a specific portion in the acquired image, the measurement accuracy can be improved by repeatedly acquiring an image of the specific portion and reducing the noise by averaging images or the like. That is, after the step S5, a step of repeatedly acquiring an image of a specific portion, a step of reducing noise based on the repeatedly acquired image, a step of measuring a dimension based on the image with reduced noise, or the like may be incorporated.

Furthermore, when performing a defect inspection of the template TP or the like, it may not be necessary to repeat the image acquisition many times. However, a step of obtaining the shape or the like (edge position or the like) of the mesa portion M based on the image and comparing it with the mesa structure information may still be provided. Even when the method described above is carried out as a measurement method or an inspection method, an image that more accurately reflects the shape of the template surface can be acquired, so that the measurement or the inspection can be performed more accurately.

Modification Example

Next, an electron beam device according to a modification example will be described. The electron beam device according to the modification example is different from the electron beam device 1 according to the first embodiment in that it has a retarding electrode 220E different from the retarding electrode 22E, but is otherwise the same in other configurations.

Figure 5A:
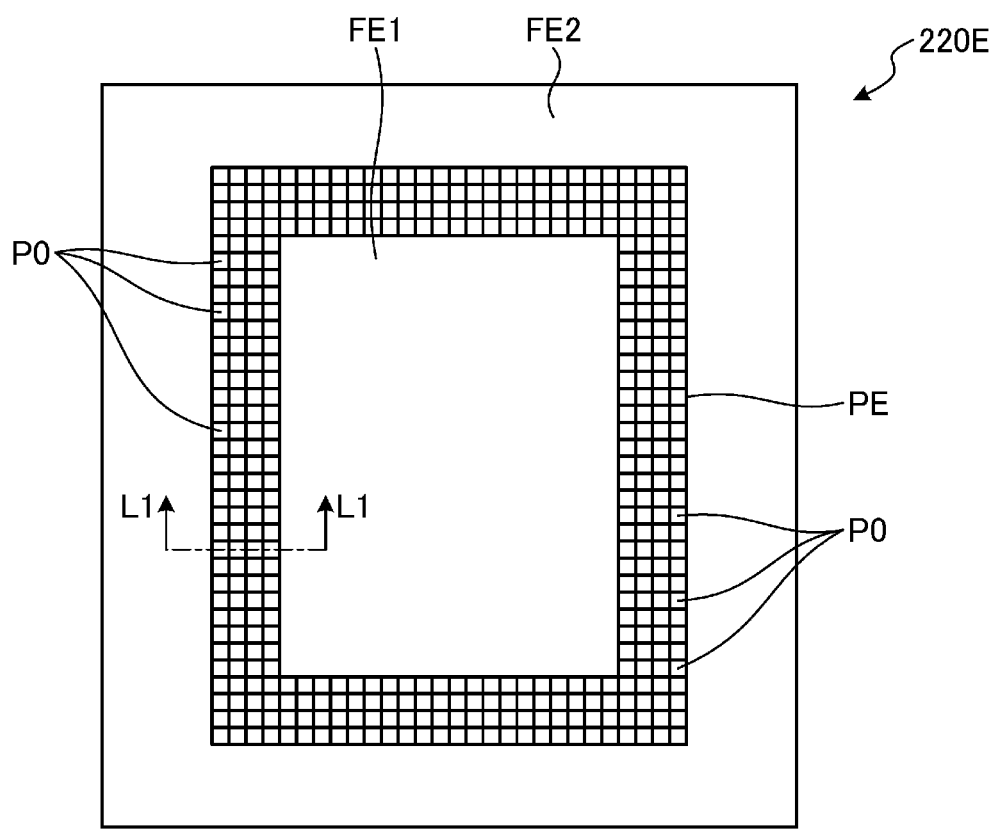
FIG. 5A is a top view schematically illustrating a retarding electrode of an electron beam device according to a modification example.
Figure 5B:
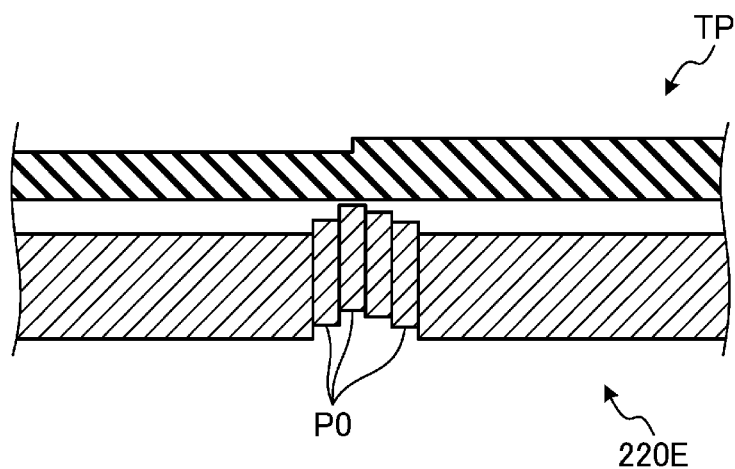
FIG. 5B is a partial cross-sectional view taken along L1-L1 line in FIG. 5A.

FIG. 5A is a top view schematically illustrating a retarding electrode 220E of an electron beam device according to a modification example, and FIG. 5B is a partial cross-sectional view taken along line L1-L1 in FIG. 5A. As illustrated in FIG. 5A, the retarding electrode 220E is substantially the same as the retarding electrode 22E in plan view. However, as illustrated in FIG. 5B, the pillar electrodes P0 of the retarding electrode 220E can be individually moved up and down by a drive mechanism. Accordingly, the distance between each of the pillar electrodes P0 and the sample S can be adjusted for each of the pillar electrodes P0. When each pillar electrode P0 moves upward, it may be brought into contact with the back surface of the sample S (e.g., template TP) which is supported by the support pin 22P.

Like the pillar electrode P, each pillar electrode P0 has, for example, the cylindrical metal body PP and the insulating film PI at the periphery thereof. A lead wire (wiring lead) is also connected to the lower end of the cylindrical body PP, and is electrically connected to the electrode control unit 27 by this lead wire. Accordingly, a voltage can be individually applied to each pillar electrode P0 by the electrode control unit 27.

Since the distance between the back surface of the sample S and each pillar electrode P0 can be adjusted, the electric field distribution on the surface of the template TP can be adjusted more accurately.

Next, an image acquisition method (which may be utilized in or as an inspection method and measurement method) carried out using the electron beam device according to the modification example will be described. FIG. 6 is a flowchart of an image acquisition method that can be carried out by using the electron beam device according to the modification example of the embodiment.

Steps S21 and S22 are the same as steps S1 and S2 in the flowchart of FIG. 3, respectively. That is, the mesa structure information is read in the step S21, and the electric field correction map is generated in the step S22. Next, in a step S23, the control computer 3 selects, for example, the pillar electrode(s) P0 of the retarding electrode 220E based on the electric field correction map, and obtains the voltage to be applied to the selected pillar(s) electrode P0, and the moving distance of the selected pillar electrode (s) P0. A control signal including this information is transmitted from the control computer 3 to the electrode control unit 27.

Next, in a step S24, the determined voltage(s) are applied to the selected pillar electrode(s) P0, and in a step S25, the selected pillar electrode (s) P0 are moved by the determined moving distance. The order of the steps S24 and S25 may be reversed or may be simultaneous.

Next, in a step S26, the electron gun control unit 23 causes the electron gun 21G to emit the electron beam EB based on the control signal from the control computer 3. Furthermore, the deflector control unit 25 causes the scanning of the electron beam EB across the template TP (sample S), and an image (SEM image) due to the secondary electron SE emitted from the surface of the template TP is acquired. Accordingly, a series of processes associated with FIG. 6 is completed.

As described above, according to the image acquisition method carried out by using the electron beam device according to the modification example, since when different voltages can applied to the retarding electrode 220E and the distance between the pillar electrode P0 of the pillar electrode region PE and the back surface of the template TP can be adjusted according to the electric field correction map created based on the mesa structure information, the electric field distribution on the surface of the template TP can be adjusted more precisely.

For example, the electric field distribution may be adjusted by moving the pillar electrode P0 up and down while applying an equal voltage to the entirety of the flat plate electrode regions FE1 and FE2 and the pillar electrode region PE. In other words, in the step S23, it may be determined that the voltage to be applied to the selected pillar electrode P0 is equal to the voltage applied to the rest of the retarding electrode 220E.

For example, in the retarding electrodes 22E and 220E, the flat plate electrode region FE1 is provided inside the pillar electrode region PE, but the pillar electrodes P and P0 may be provided instead of the flat plate electrode region FE1. According to this, for example, in a template having a three-dimensional structure, it is possible to reduce the variations in the electric field distribution caused by not only the edge of the mesa portion M but also a step or the like inside the edge.

The pillar electrodes P and P0 are not limited to the cylindrical body PP, and may have a prism shape such as a quadrilateral or a hexagon. Even in this case, the insulating film PI is provided surrounding the prism.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. An electron beam device for acquiring an image of a sample, the electron beam device comprising:
    a support on which a sample can be supported;
    an electrode for applying voltages to the sample being supported by the support, the electrode being between the sample and the support, the electrode including a plurality of columnar electrodes which can each be independently controlled to apply a different voltage; and
    a controller configured to:
        generate correction data for adjusting the distribution of an electric field generated in the sample when a voltage is applied to the sample via the electrode, the correction data being based on structure information indicating a structure of the sample, and
        control the plurality of columnar electrodes to apply local voltages set based on the correction data.

2. The electron beam device according to claim 1, wherein the sample has a flat surface portion and a raised portion which protrudes from the flat surface portion, and the plurality of columnar electrodes are in positions corresponding to the position of the raised portion.

3. The electron beam device according to claim 1, wherein each of the columnar electrodes is movable to change a vertical distance between the respective columnar electrode and the sample.

4. The electron beam device according to claim 1, wherein the structure information includes information on a planar shape and a height of the sample.

5. The electron beam device according to claim 1, wherein each of the columnar electrodes has a columnar body formed of a conductive material and an insulating film which covers an outer peripheral surface of the columnar body.

6. The electron beam device according to claim 1, wherein the electrode is integrated with the support.

7. The electron beam device according to claim 1, wherein the electrode includes a flat plate region surrounded by the plurality of columnar electrodes.

8. The electron beam device according to claim 1, wherein the support includes support pins which contact a backside of the sample.

9. The electron beam device according to claim 1, further comprising:
    an electron gun configured to supply electrons for imaging the sample.

10. An image acquisition method, comprising:
    generating correction data for adjusting the distribution of an electric field generated in a sample when a voltage is applied to the sample via an electrode on backside of the sample, the correction data being based on structure information indicating a structure of the sample;

controlling a plurality of columnar electrodes that are at different positions on the electrode to apply locally different voltages to the sample based on the correction data; and irradiating the sample with electrons to acquire an image of the sample.

11. The image acquisition method according to claim 10, wherein the structure information includes information about a planar shape and a height of the sample.

12. The image acquisition method according to claim 10, wherein the application of the locally different voltages is performed by changing a distance between the columnar electrodes and the sample.

13. The image acquisition method according to claim 10, wherein the application of the locally different voltages is performed by applying different voltages to the plurality of columnar electrodes.

14. The image acquisition method according to claim 10, wherein the structure information indicates a physical shape of a structure on a surface of the sample.

15. The image acquisition method according to claim 10, wherein the sample is an imprint template with a mesa structure, and the structure information indicates a planar shape of the mesa structure.

16. The image acquisition method according to claim 15, wherein the structure information is CAD data used when designing the mesa structure.

17. The image acquisition method according to claim 10, wherein the electrode includes a flat plate region surrounded by the plurality of columnar electrodes.

18. An image acquisition system for imprint templates, the system comprising:

an electron microscope including:
  a sample chamber,
  a sample support in the sample chamber on which a sample can be supported, and
  a sample biasing electrode on the sample support, the sample biasing electrode including a plurality of columnar electrodes which can each be independently controlled to apply a different voltage to the sample being supported by the sample support; and
a control computer connected to the electron microscope and configured to:
  receive structure information from a storage device, the structure information indicating a position and planar shape of a mesa structure of a template,
  generate correction data for adjusting the distribution of an electric field generated in the template when a voltage is applied to the template via the sample biasing electrode, the correction data being based on the received structure information, and
  control the plurality of columnar electrodes to apply local voltages set based on the correction data to minimize variations in the distribution of the electric field across the template.

19. The image acquisition system according to claim 18, wherein the sample biasing electrode includes a flat plate region surrounded by the plurality of columnar electrodes.

20. The image acquisition system according to claim 18, wherein each of the columnar electrodes is movable to change a vertical distance between the respective columnar electrode and the sample.

* * * * *